United States Patent
Fujiwara

(10) Patent No.: US 9,063,381 B2
(45) Date of Patent: Jun. 23, 2015

(54) LIQUID CRYSTAL DISPLAY DEVICE HAVING PARTICULAR SEALING STRUCTURE

(71) Applicant: Japan Display Inc., Tokyo (JP)

(72) Inventor: Tsuyoshi Fujiwara, Mobara (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 13/916,843

(22) Filed: Jun. 13, 2013

(65) Prior Publication Data
US 2013/0335690 A1 Dec. 19, 2013

(30) Foreign Application Priority Data

Jun. 14, 2012 (JP) ................................ 2012-134364

(51) Int. Cl.
| | | |
|---|---|---|
| *G02F 1/1333* | (2006.01) | |
| *G02F 1/1345* | (2006.01) | |
| *G02F 1/1343* | (2006.01) | |
| *G02F 1/1339* | (2006.01) | |
| *G02F 1/1335* | (2006.01) | |
| *G02F 1/1337* | (2006.01) | |

(52) U.S. Cl.
CPC ........ *G02F 1/1339* (2013.01); *G02F 1/133512* (2013.01); *G02F 1/133784* (2013.01); *G02F 1/1345* (2013.01)

(58) Field of Classification Search
CPC ... G02F 1/1339; G02F 1/1341; G02F 1/1345; G02F 1/133351; G02F 1/13394; G02F 2001/13415; G02F 1/136286; G02F 1/133707; G02F 1/134336; G02F 1/13452; G02F 1/13458; H05K 3/361
USPC .......................... 349/139, 149, 152, 153, 190
See application file for complete search history.

(56) References Cited

U.S. PATENT DOCUMENTS

| | | | | |
|---|---|---|---|---|
| 7,436,473 B2* | 10/2008 | Nam et al. | ..................... | 349/110 |
| 2005/0190335 A1* | 9/2005 | Maruyama et al. | ........... | 349/153 |
| 2007/0216830 A1* | 9/2007 | Hoshino et al. | .................. | 349/86 |
| 2008/0284963 A1* | 11/2008 | Kamiya et al. | ................ | 349/139 |
| 2008/0309866 A1* | 12/2008 | Huang et al. | .................. | 349/153 |
| 2009/0231534 A1* | 9/2009 | Morita | ........................... | 349/153 |
| 2010/0225871 A1 | 9/2010 | Maruyama | | |
| 2011/0273423 A1* | 11/2011 | Hsu et al. | ....................... | 345/211 |

FOREIGN PATENT DOCUMENTS

JP          2010-204417          9/2010

* cited by examiner

*Primary Examiner* — Mike Qi
(74) *Attorney, Agent, or Firm* — Lowe Hauptman & Ham, LLP

(57) ABSTRACT

A liquid crystal display device comprises a TFT substrate, forming a wiring made of a material shutting off UV rays on a peripheral region thereof, and a sealing layer, including a UV ray curable resin therein, and being formed on peripheral regions of the substrate, to enclose the liquid crystal layer. The wiring and the sealing layer formed on the peripheral region are so provided that they are put on each other, at least in part thereof, on the wiring are provided plural numbers of opening portions formed in region where the wiring and the sealing layer are put on each other, and the opening portions are divided into a first area beside a display region and a second area outside the first area, and an opening ratio of the opening portions of the first area is larger than the opening ratio of the opening portions of the second area.

14 Claims, 8 Drawing Sheets

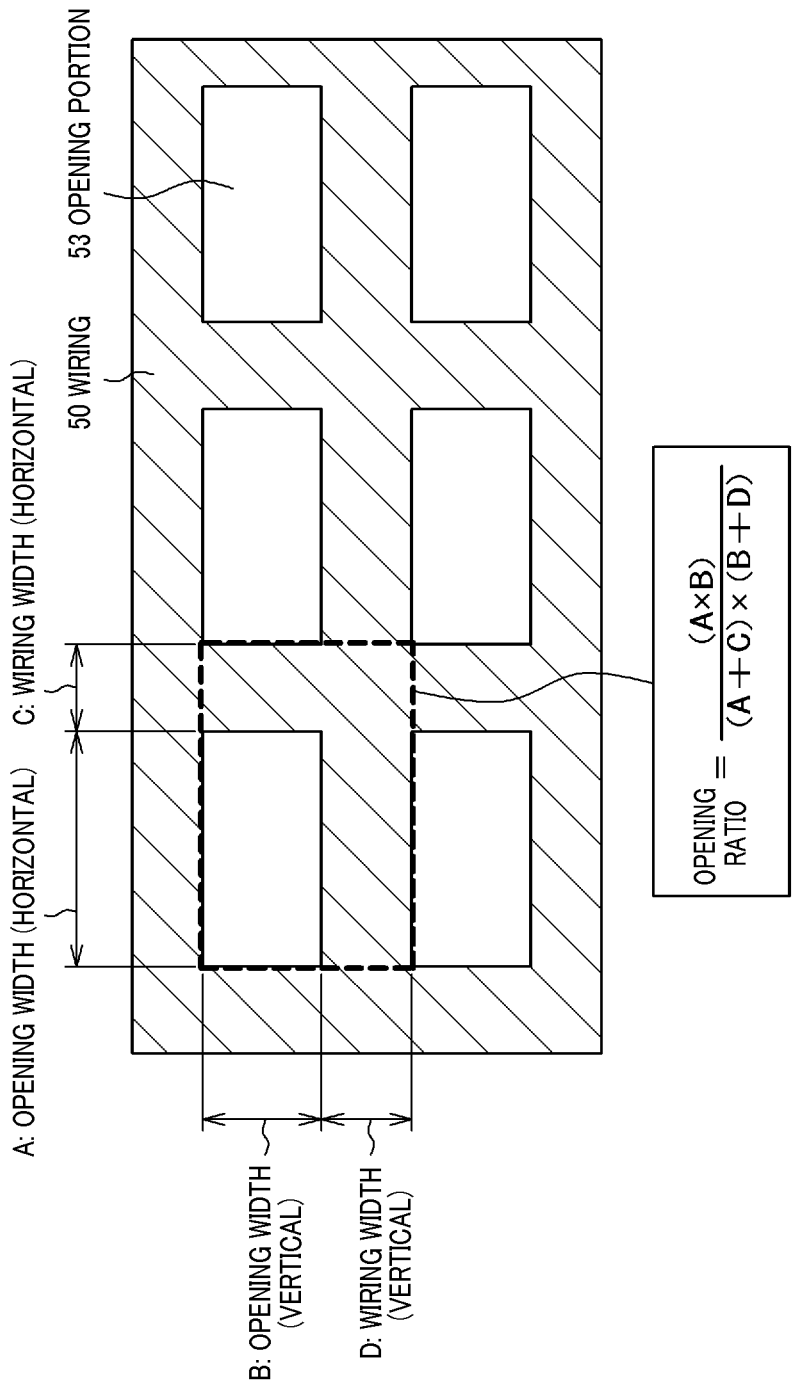

LIQUID CRYSTAL DISPLAY DEVICE HAVING PARTICULAR SEALING STRUCTURE

CLAIM OF PRIORITY

The present application claims priority from Japanese patent application JP2012-134364 filed on Jun. 14, 2012, the content of which is hereby incorporated by reference into this application.

BACKGROUND OF THE INVENTION

1. Field of the Invention

The present invention relates to a liquid crystal display device, applying a sealing member including an ultraviolet ray curable resin therein, and in particular, relates to a liquid crystal display device, improving durability thereof against an external force, such as, sliding and/or pressure, etc., when being applied with polishing thereon, with encouraging curing of the seal.

2. Description of the Related Art

As a method for forming a liquid crystal layer between a TFT substrate and a substrate facing thereto (hereinafter, a facing substrate), in the liquid crystal display device, an ODF (One Drop Fill) method has been developed. In this method, a sealing layer is formed on the peripheral region of a substrate, to drop a liquid crystal within a frame of the sealing layer, and the TFT substrate and the facing substrate are piled up on each other, and thereby sealing the liquid crystal therein. As a material of the sealing member is applied a UV (ultra-violet) curable type resin or a concomitant type resin, combining the UV curable resin and a heat curable resin, and it is cured through irradiation of UV rays after lamination of those two pieces of substrates.

On the other hand, with the liquid crystal display device, there are provided wirings, such as, a common wiring, etc., on the peripheral portion of the TFT substrate. Due to a demand of sizing small and narrowing the frame of the liquid crystal display device, the wirings provided on the peripheral portion and the sealing layer for sealing the liquid crystal layer are disposed to be piled up on each other. However, in general, the wirings shut off the lights, and then curing of the sealing layer through irradiation of the UV rays comes to be insufficient.

Then, in the Japanese Patent Application Laid-Open Publication No. 2010-204417 is described a technology for curing the sealing agent in a short time-period, with high efficiency, with provision of an opening for use of passing the UV rays therethrough upon the wiring on the periphery, in the liquid crystal display device, forming the sealing layer of the photo curable type resin or the concomitant type resin, on the peripheral region, and having the wirings of a material, which shuts off the UV rays on the peripheral region of the substrate (please see the second embodiment thereof).

SUMMARY OF THE INVENTION

In the Japanese Patent Application Laid-Open Publication No. 2010-204417, as is shown in FIG. 14 and FIG. 15 thereof, the openings 19 for use of passing the UV rays therethrough are provided on both sides along a side portion of the wiring 13, i.e., in places on both sides of the sealing layer. However, with such structure of this opening, the curing of the sealing is not always sufficient. If the curing of sealing of the sealing layer is short, then for example, this results shortage of durability against the external force, such as, sliding and/or pressure, etc. For this reason, a column-like spacer on a surface of the facing substrate and the wirings on a surface of the TFT substrate rub on each other, so that cutting of an alignment film is generated on the column-like spacer and the wiring; i.e., generating a defect of minute bright spot on a screen.

Also, if enlarging an opening ratio of the wiring, there would be generated a problem of increasing the resistance of the wiring. Such increase of resistance of the wiring brings about a possibility of badness in the display, a lowering of quality of display, and/or breakdown of wires, etc. For example, in case where the resistance of a common wire increases, common electric potential of a specific pixel cannot converge within a gate selection time; i.e., there is a possibility of problems, such as, changing of the degree of whiteness on a specific display pattern, or coloring, etc.

The present invention, accomplished for dissolving such problems, has an object to provide a liquid crystal display device having durability against the external force, such as, sliding and/or pressure, i.e., a mechanical polishing. Also, in addition thereto, it has an object of suppressing the increase of the wiring resistance down to the minimum.

For dissolving such problem(s) as mentioned above, if listing up an example of the liquid crystal display device, there is provided a liquid crystal display device, comprising: a TFT substrate, having pixel electrodes and TFTs thereon and forming a wiring made of a material shutting off UV rays on a peripheral region thereof; a facing substrate to be disposed to face the TFT substrate; a liquid crystal layer put between the both substrates; and a sealing layer, including a UV ray curable resin therein, and being formed on peripheral regions of the both substrate, to enclose the liquid crystal layer, wherein the wiring and the sealing layer formed on the peripheral region are so provided that they are put on each other, at least in part thereof, on the wiring are provided plural numbers of opening portions formed in region where the wiring and the sealing layer are put on each other, and the opening portions are divided into a first area beside a display region and a second area outside the first area with respect to the display region, and an opening ratio of the opening portions of the first area is larger than the opening ratio of the opening portions of the second area.

Also, according to the present invention, in the liquid crystal display device, as described in above, preferably, the opening ratio of the opening portions of the first area is 30 to 80%, while the opening ratio of the opening portions of the second area is 5 to 50%, more preferably, the opening ratio of the opening portions of the first area is 50 to 70%, and more preferably, the opening ratio of the opening portions of the second area is 5 to 30%.

If listing up other example of the liquid crystal display device, there is also provided a liquid crystal display device, comprising: a TFT substrate, having pixel electrodes and TFTs thereon and forming a wiring made of a material shutting off UV rays on a peripheral region thereof; a facing substrate to be disposed to face the TFT substrate; a liquid crystal layer put between the both substrates; and a sealing layer, including a UV ray curable resin therein, and being formed on peripheral regions of the both substrate, to enclose the liquid crystal layer, wherein the wiring and the sealing layer formed on the peripheral region are so provided that they are put on each other, at least in part thereof, on the wiring are provided plural numbers of opening portions formed in region where the wiring and the sealing layer are put on each other, and an opening ratio of the opening portion is 30 to 80%.

Also, if listing up further other example of the liquid crystal display device, there is also provided a liquid crystal display device, a TFT substrate, having pixel electrodes and TFTs thereon and forming a wiring made of a material shutting off UV rays on a peripheral region thereof; a facing substrate to be disposed to face the TFT substrate; a liquid crystal layer put between the both substrates; and a sealing layer, including a UV ray curable resin therein, and being formed on peripheral regions of the both substrate, to enclose the liquid crystal layer, wherein the wiring and the sealing layer formed on the peripheral region are so provided that they are put on each other, at least in part thereof, and on the wiring, plural numbers of opening portions are provided in a region where the wiring and the sealing member are put on each other, and in an inside of the sealing layer.

With the present invention mentioned above, since a transmission factor for the UV rays is increased in the wiring portions, then curing of a seal of the sealing layer is promoted; therefore, rubbing between the column-like spacer and the TFT wiring can be suppressed, when receiving the external force of the sliding and/or the pressure, etc., i.e., the mechanical polishing thereon, and therefore it is possible to prevent the alignment film from being cut out.

Also, with making the opening ratio on the wiring in the second area smaller than that in the first area, which lies outside than the first area with respect to the display region, it is possible to suppress an increase of the resistance of the wiring down to the minimum.

BRIEF DESCRIPTION OF THE DRAWINGS

Those and other objects, features and advantages of the present invention will become more readily apparent from the following detailed description when taken in conjunction with the accompanying drawings wherein:

FIG. 9 is a view for explaining an opening ratio.

DETAILED DESCRIPTION OF THE INVENTION

Hereinafter, embodiments according to the present invention will be fully explained by referring to the attached drawings. In each drawing, the same numeral references will be given to the same constituent elements, as far as possible, and repetitive explanations thereof will be omitted.

Before explaining the embodiments, an explanation will be given on an outline of the liquid crystal display device.

Figure 3:
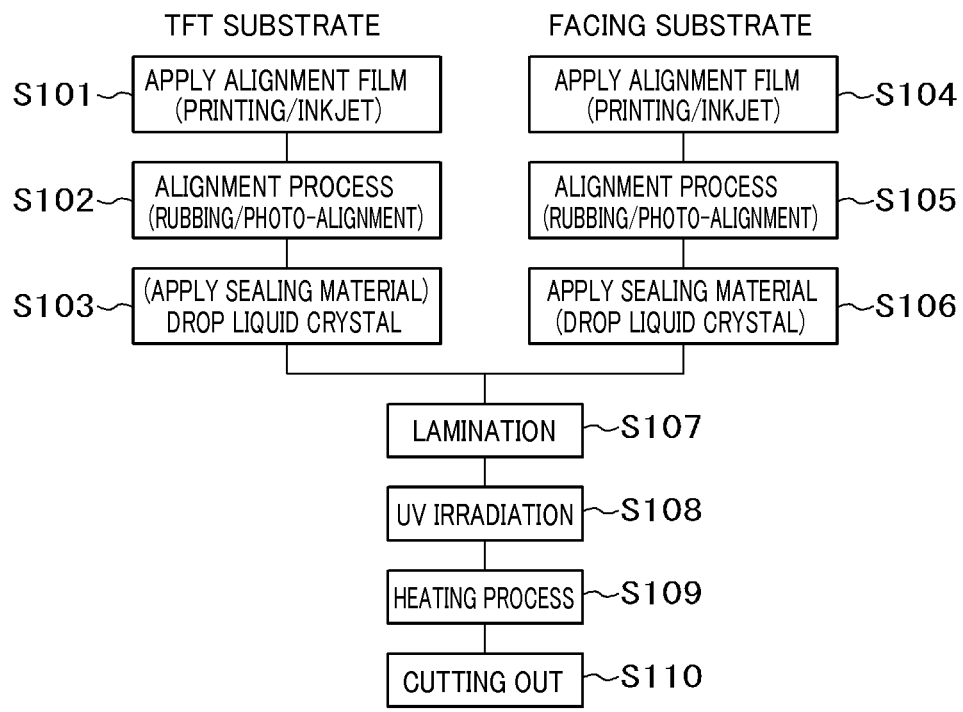
FIG. 3 is a view for showing manufacturing processes of the liquid crystal display device, into which an ODF process is applied.

FIG. 3 shows a flow of processes for forming liquid crystal display cells, into which the ODF process is applied, being a target of the present invention. After applying an alignment film on a TFT substrate, which forms TFTs (Thin Film Transistors) and/or pixel electrodes thereon, with using a printing method or an inkjet method (S101), an alignment film is formed for aligning a liquid crystal, according to a rubbing method or a photo-alignment method (S102), and then a liquid crystal is dropped (S103). Similarly, after applying the alignment film on the facing substrate forming a color filter (CF) thereon, through the printing method or the inkjet method (S104), an alignment film is formed for aligning a liquid crystal, according to a rubbing method or a photo-alignment method (S105), and then a sealing material is applied thereon (S106). And, liquid crystal display cells are formed by laminating the TFT substrate, on which the liquid crystal is dropped, on the facing substrate, on which the sealing material is applied (S107). Thereafter, in a step S108 is irradiated ultraviolet (UV) rays thereupon and in a step S109 is conducted a heating process thereon, then the sealing material is cured. And, in a step S110, the substrate is cut out and separated, and then each liquid crystal cell is manufactured. Though not shown in the figure, there are cases of introducing a step of mechanically polishing the substrate to be thin, before the step of cutting (S110). Further, in the steps S103 and S106, the sealing material may be applied on the TFT substrate and the liquid crystal may be dropped on the facing substrate, or on both substrates may be conducted the application of the sealing agent and the drop of the liquid crystal. The sealing material to be applied in the present invention may be one, which can be cured through the irradiation of the UV rays thereon, such as, the UV curable type resin or the concomitant type resin, combining the UV curable resin and the heat curable resin, for example.

Figure 4:
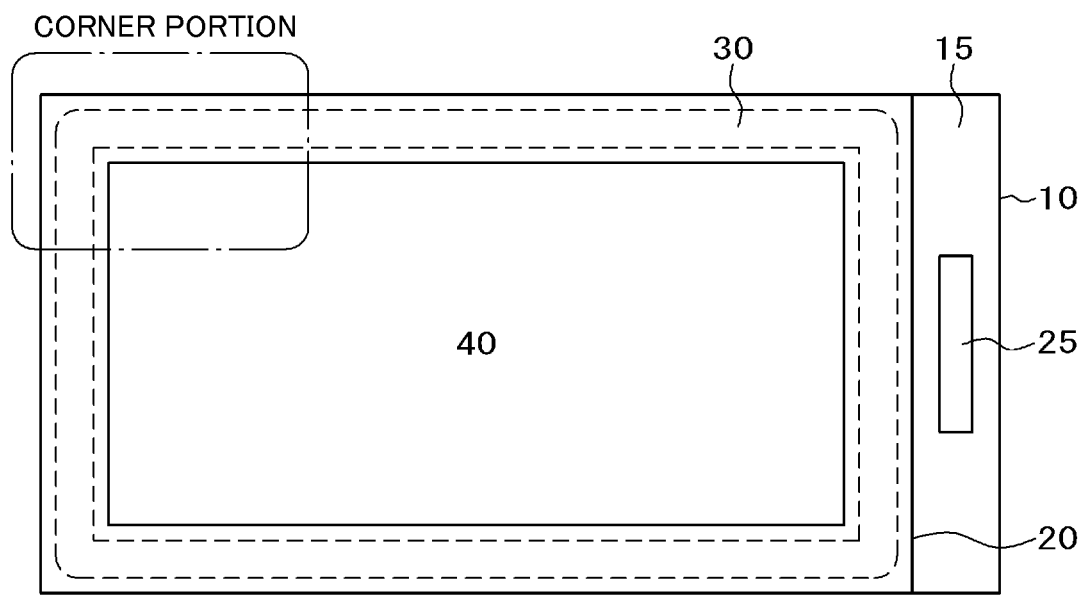
FIG. 4 is a plane view for showing the structures of the liquid crystal display device, briefly.

FIG. 4 is a plane view for showing the structures of the liquid crystal display device, briefly. The TFT substrate 10 and the facing substrate 20 are adhered with, by means of the sealing member provided on the peripheral region of the substrate. Inside the sealing member 30 is formed a display region 40. In the display region 40 of the TFT substrate 10 are formed pixel electrodes, in a matrix manner. In the display region 40 of the facing substrate 20 are formed color filters corresponding to the pixels of the TFT substrate 10.

Up to a terminal portion 15 of the TFT substrate 10 are drown out wirings, such as, a gate wiring, a source wiring, etc., to be connected with a driver 25. From this driver 25 is drawn out a common wiring 50, and it is formed in a panel periphery portion.

First Embodiment

Figure 1:
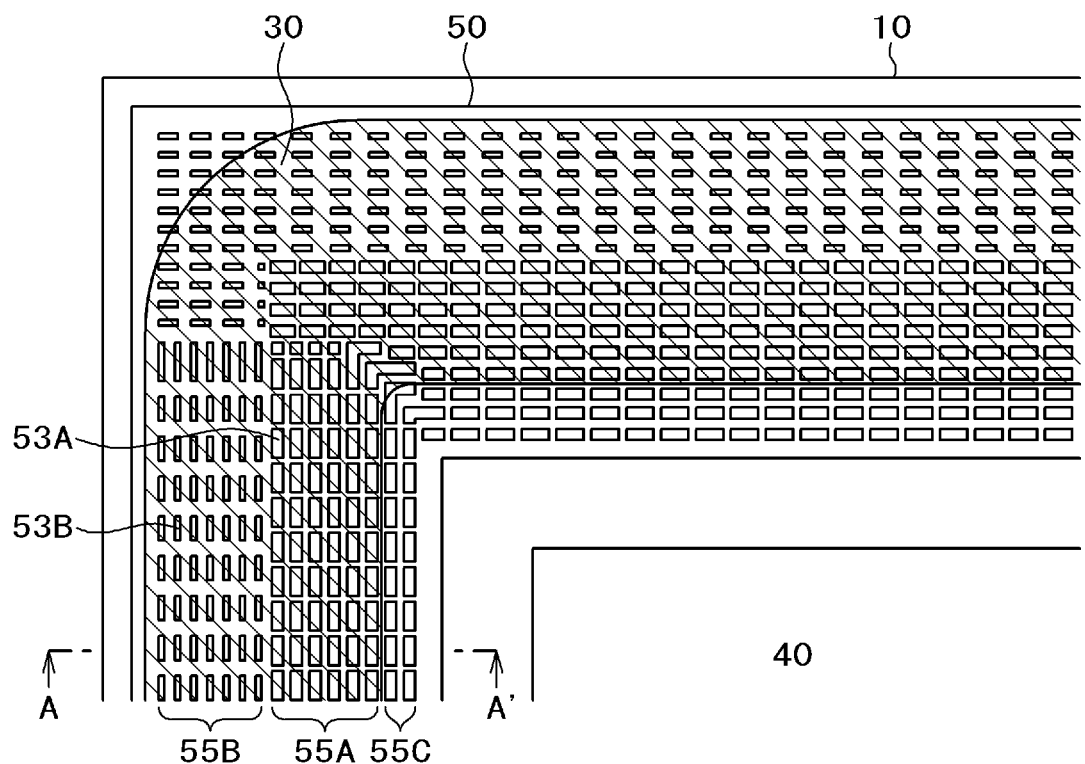
FIG. 1 is a plane view of a corner portion of a liquid crystal display device, according to an embodiment 1 of the present invention.
Figure 2:
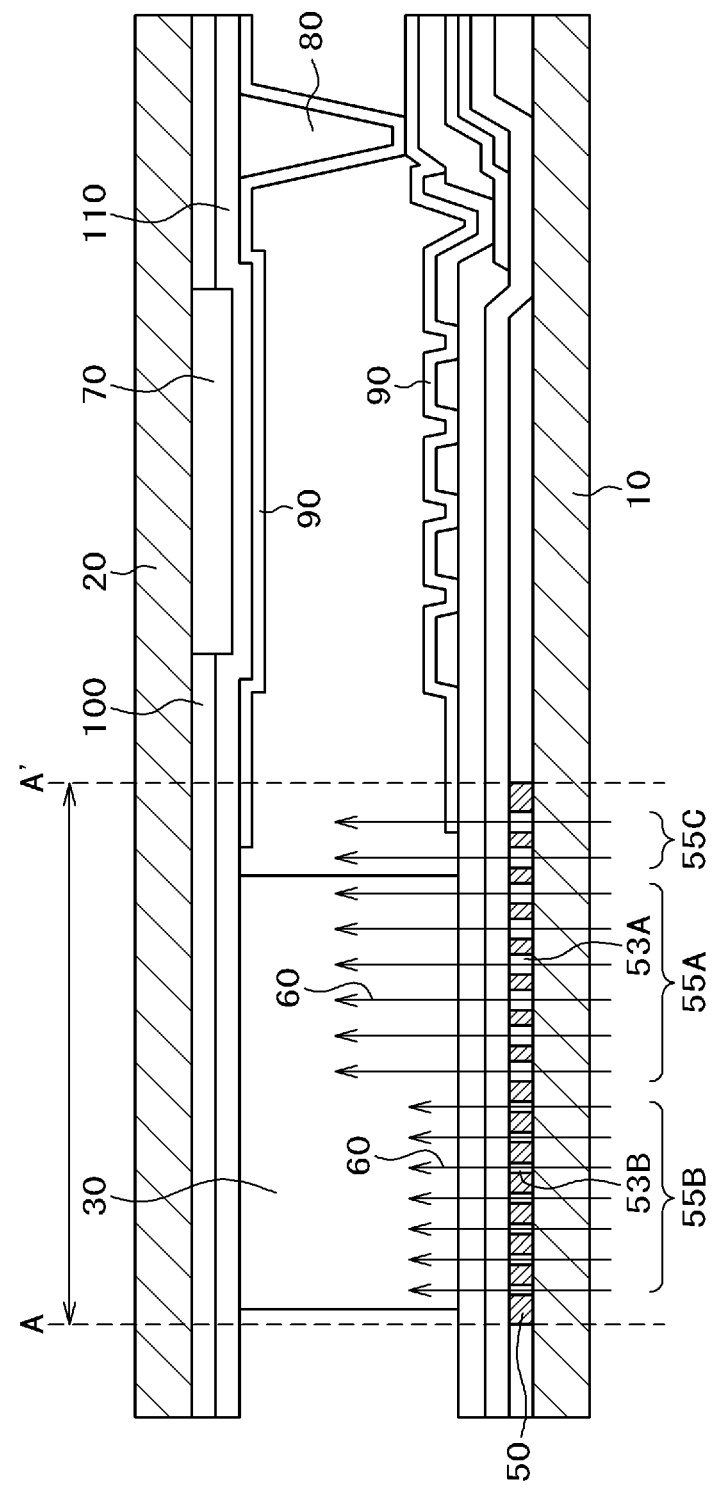
FIG. 2 is a cross-section view of the corner portion of the liquid crystal display device, according to the embodiment 1 of the present invention.

FIG. 1 is an enlarged view of the panel periphery portion of an embodiment 1, corresponding to a corner portion shown in FIG. 4. Also, FIG. 2 is a cross-section view of the panel periphery portion of the embodiment 1, in the direction shown by an A-A' line in FIG. 1. On the panel periphery portion is formed the common wiring 50, and it is disposed at a position piling on the sealing member 30 mentioned above. On the common wiring 50 are formed opening portions 53A and 53B, for letting the UV rays 60 to pass therethrough, so as to cure the sealing material, in the region lying on the sealing member 30. The opening portions 53A are formed in a first area 55A beside the display region, while the opening portions 53B are formed in a second area, which lies outside than the first area with respect to the display region. In the present embodiment, an opening ratio of the opening portion 53A, which is formed beside the display region, is determined to be larger than the opening ratio of the opening portion 53B, which is formed outside the first area. However, in the figure, the opening portions 53A (53B) are formed to be equal to each other; however, there is no necessity of forming them to be equal to.

A size and a number of dispositions of the opening portions 53A, which are formed in the first area beside the display region, are set to be such degrees, that the sealing member 30 can be cured, fully, thereby obtaining a sufficient durability against an external force, such as, the sliding and/or the pressure, etc.; in other words, the opening ratio is determined to 30 to 80%, and more preferably, to 50 to 70%. If the opening ratio is smaller than 30%, the curing of the sealing material comes to be insufficient. A size and a number of dispositions of the opening portions 53B, which are formed in the second area, lying outer than the first area, are set to be such degrees, that an amount of light of the UV rays necessary for adhering or bonding the TFT substrate 10 and the facing substrate 20 can be obtained, at the minimum; in other words, the opening ratio is determined to 5 to 50%, and more preferably, to 5 to 30%. If the opening ratio is larger than 50%, the resistance of the common wiring is increased. As an example, the opening ratio of the opening portion 53A in the first area beside the display region of the sealing member 30 is set to 53%, while the opening ratio of the opening portion 53B in the second area outer than the first area of the sealing member to 8%.

For width of the first area 55A beside the display region of the opening portion 53A, it is necessary to be equal to or greater than 30%, for the purpose of suppressing the rubbing between the column-like spacer and the TFT wiring, so as to prevent the alignment film from being cut out, and more preferably, to be equal to or greater than 50%.

Herein, explanation will be given on the opening ratio, by referring to FIG. 9. The opening ratio is presented by a ratio of an area of the opening portion with respect to a unit of area. As is shown in FIG. 9, in case where a rectangular opening portion is provided within a rectangular unit of area, the opening ratio can be presented by the following equation, where assuming that width of the opening in the vertical direction is "B" and width of the wiring in the vertical direction is "D", and that widths of the opening and the wiring are "A" and "C" in the horizontal direction:

opening ratio=$(A \times B)/(A+C) \times (B+D)$

In order to increase the opening ratio, it is enough to enlarge the area of the opening portion, or alternately, to increase the number of the opening portions.

However, in FIG. 2, a reference numeral 70 depicts the color filter, which is provided on the facing substrate, and a reference numeral 80 depicts the column-like spacer, and a reference numeral 100 depicts a BM (i.e., a black matrix), and a reference numeral 110 depicts an OC (i.e., an over coating), respectively, while a reference numeral 90 depicts alignment films, which are formed on the TFT substrate and the facing substrate, respectively.

With the embodiment 1, since the opening ratio of the opening portion 53A on the wiring in the first area 55A beside the display region is determined to be large, a ratio of passing of the UV rays is increased, on the sealing layer beside the display region; thereby encouraging the curing of the seal. And, the opening ratio of the opening portion 53B on the wiring in the second area 55B outer than the first area is not enlarged, the resistance of the common wiring is not increased than the enlargement of the opening ratio on the entire surface of the common wiring. In particular, since the opening ratio is determined to be large in the first area 55A beside the display region near to the column-like spacer, etc., then the curing of the seal is accelerated on the side of the display region, than the enlargement of the opening ratio in the second area 55B outer than the first area; therefore, an amount of deformation of the panel is lessened. For this reason, rubbing between the column-like spacer and the TFT wiring can be suppressed down, when receiving the external force of the sliding and/or the pressure, etc., such as, the mechanical polishing thereon, and therefore, it is possible to prevent the alignment film from being cut out.

In this embodiment, further, as is shown in FIG. 1, in case where width of the common wiring 50 is wider that the width of the sealing member 30, the opening portions 53A are formed also in a region (i.e., an interior region of the sealing member) 55C where no sealing member 30 is formed beside the display region. The UV rays passing through this region 55C are diffused to be irradiated upon the sealing member 30, so that an amount of irradiation of the UV rays is increased up, on the side of the display region of the sealing member 30, and thereby the curing of the seal is encouraged or accelerated, much more.

Comparative Example

Figure 5:
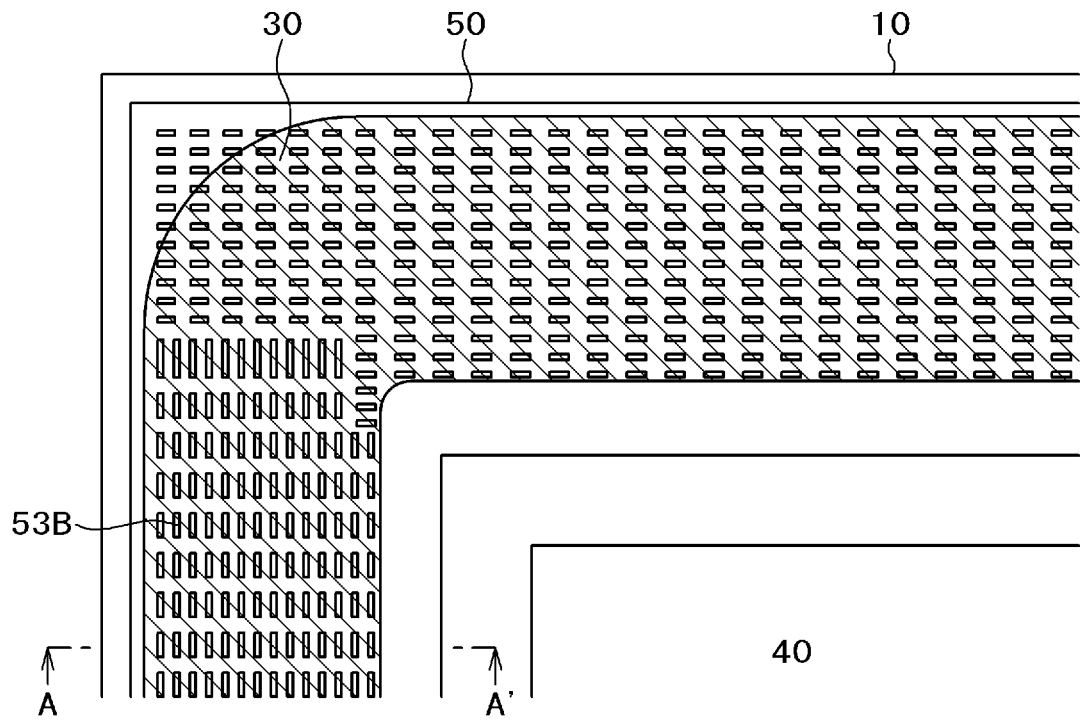
FIG. 5 is a plane view of the corner portion of the liquid crystal display device, according to a comparative example.
Figure 6:
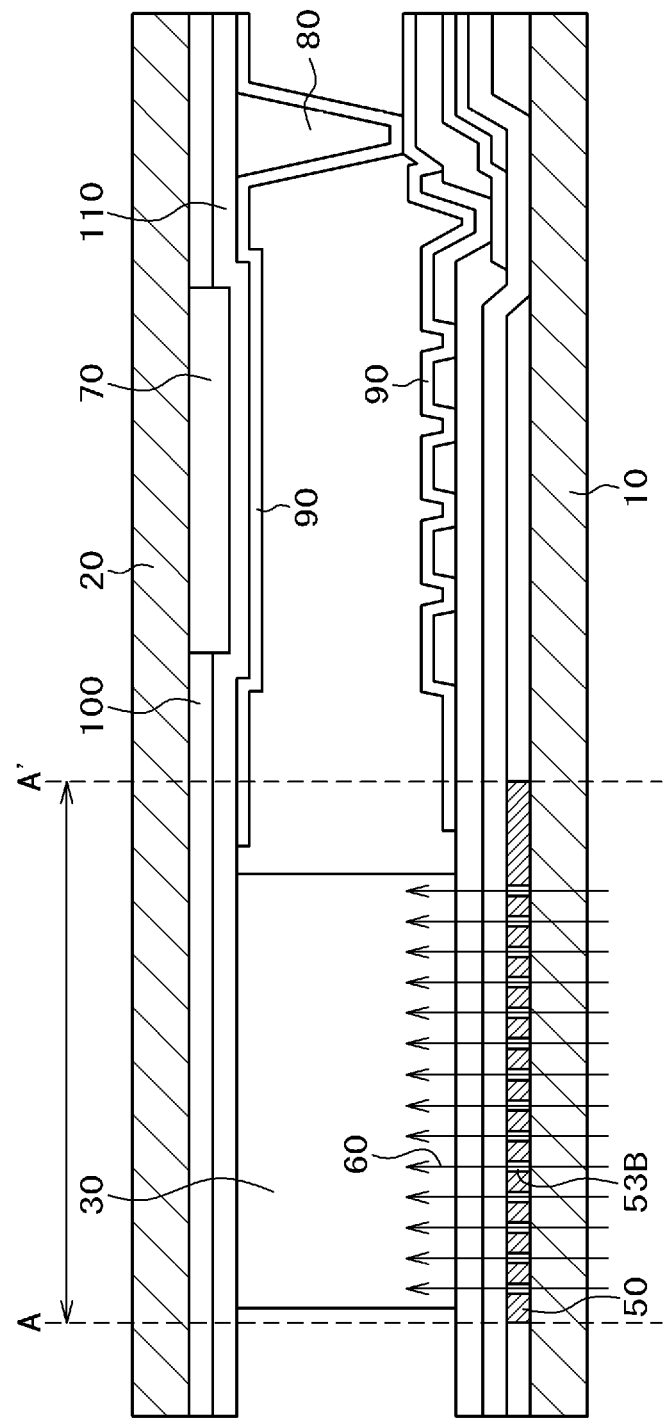
FIG. 6 is a cross-section view of the corner portion of the liquid crystal display device, according to the comparative example.

For comparison, in FIG. 5 and FIG. 6 are shown a plane view and a cross-section view, in case of determining the opening ratio of the opening portions 53B on the entire surface of the common wiring 50 to be 8%.

In this case, the UV rays 60 are hardly irradiated upon the sealing member 30, and due to shortage of the curing of the sealing member 30, an amount of deformation of the panel comes to large, when receiving the external force, such as, the sliding and/or the pressure, etc., and since the column-like spacers 80, which are formed on the facing substrate 20, contact strongly on the wirings, which are formed on the TFT substrate 10, then the alignment films 90, which are formed on the surfaces of the facing substrate 20 and the TFT substrate 10, are cut out, and there may be brought about a wear that a minute bright spot can be generated.

Second Embodiment

A second embodiment is that, in which the opening ratio of the opening portion is enlarged, in the entire regions of the common wirings where they pile up on the sealing member.

Figure 7:
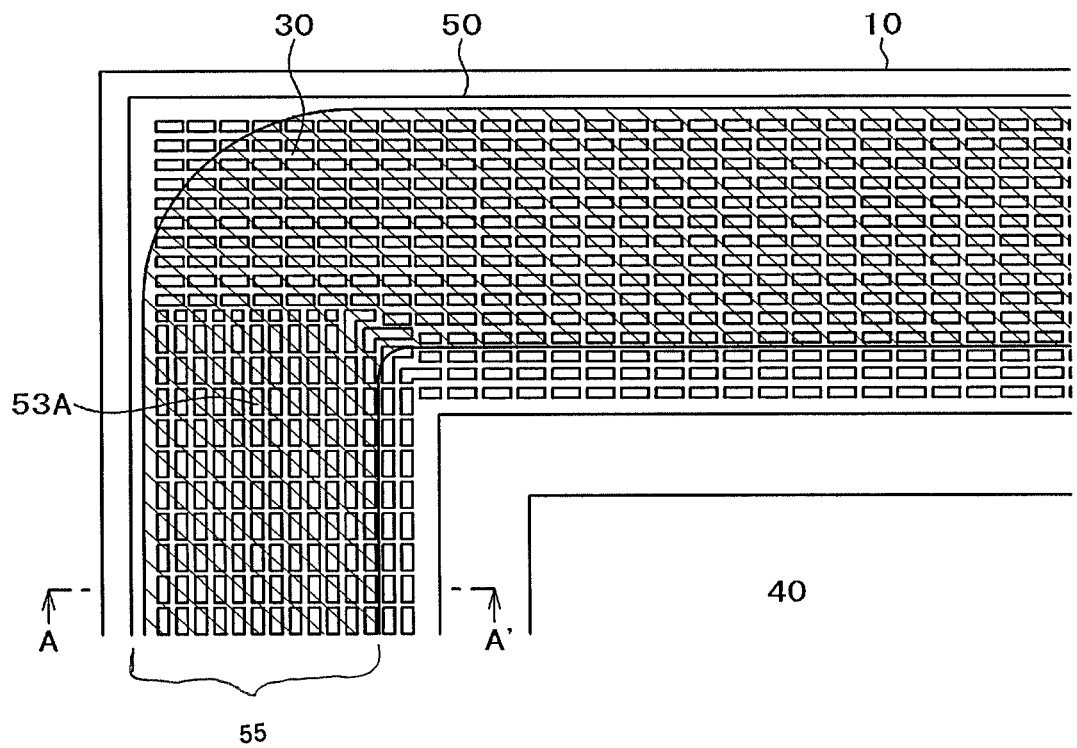
FIG. 7 is a plane view of a corner portion of a liquid crystal display device, according to an embodiment 2 of the present invention.
Figure 8:
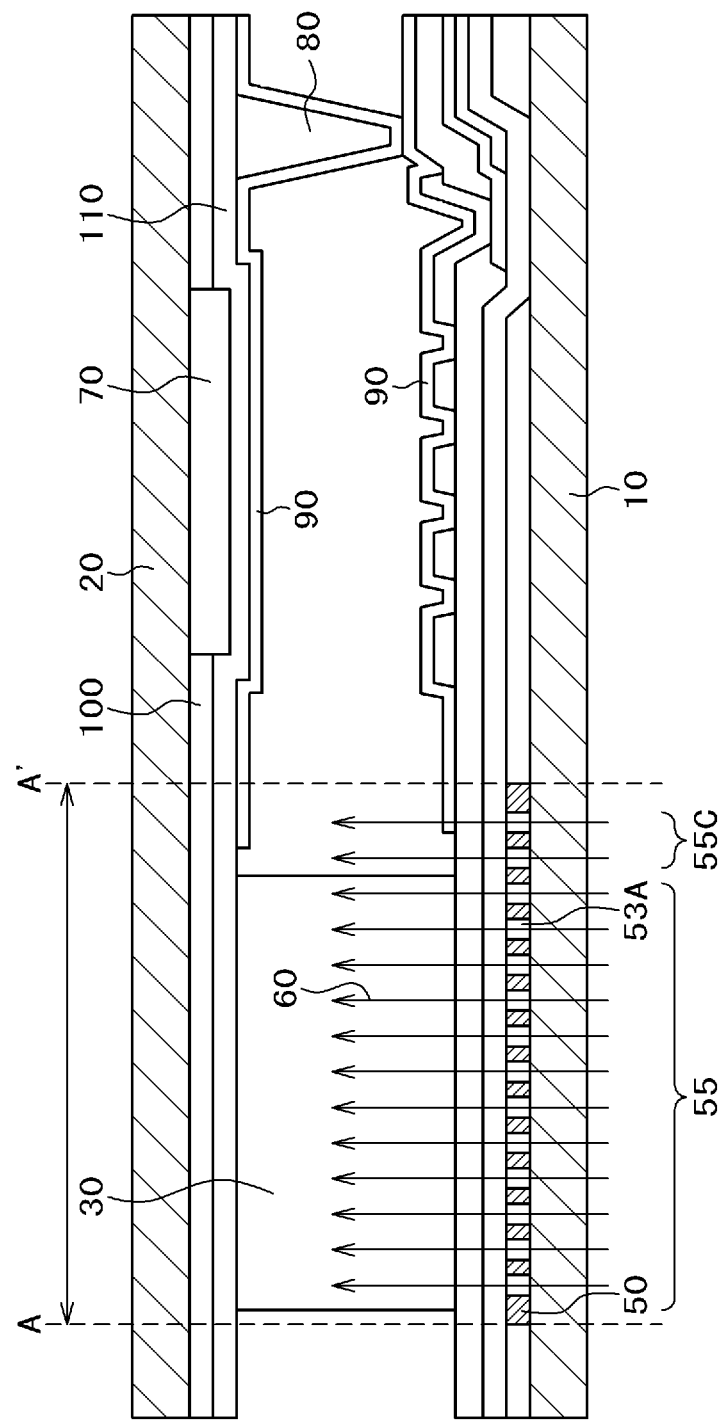
FIG. 8 is a cross-section view of the corner portion of the liquid crystal display device, according to the embodiment 2 of the present invention.

FIG. 7 is an enlarged view of a panel periphery portion according to an embodiment 2, corresponding to the corner portion shown in FIG. 4. FIG. 8 is also a cross-section view of the panel periphery portion of the embodiment 2, in the direction shown by an A-A' line in FIG. 7. Within the panel periphery portion is formed such common wiring 50 as mentioned above, and it lies at the position piling up the sealing member 30 mentioned above. On the common wiring 50 are formed the opening portions 53A, each being enlarged in the opening ratio for the UV rays 60 to pass therethrough, and thereby curing the sealing member, covering over the entire regions 55 on the sealing member 30.

A size and a number of dispositions of the opening portions 53A are set to be such degrees, that the sealing member 30 can be cured, fully, thereby obtaining a sufficient durability against an external force, such as, the sliding and/or the pressure, etc.; in other words, the opening ratio is determined to 30 to 80%, and more preferably, to 50 to 70%. If the opening ratio is smaller than 30%, the curing of the sealing member comes to be insufficient. If the opening ratio comes to be larger than 80%, the resistance of the wiring is increased up, then there is generated a possibility of lowering the quality of display or breaking down the wire, etc. As an example, the opening ratio of the opening portion 53A is determined to be 53%.

With such embodiment 2, because the opening ratio of the opening portion 53A on the wiring 50 is made large all over the entire region 55 of the common wiring 50, piling on the sealing member 30, a transmission factor for the UV rays is increased, and the curing of seal is accelerated. For this reason, rubbing between the column-like spacer and the TFT wiring can be suppressed down, when receiving the external force of the sliding and/or the pressure, etc., such as, upon the mechanical polishing thereon, and therefore, it is possible to prevent the alignment films from being cut out.

Also, in this embodiment, as is shown in FIG. 7, in case where the width of the common wiring 50 is wider than the width of the sealing member 30, the opening portions 53A are formed also in the region (i.e., the region inside the sealing member) 55C where no sealing member 30 is formed beside the display region. The UV rays passing through this region 55C are diffused to be irradiated upon the sealing member 30, so that an amount of irradiation of the UV rays is increased up, on the side of the display region of the sealing member 30, and thereby the curing of the seal is encouraged, much more.

According to the present invention, it is possible to manufacture the liquid crystal display device having the durability against the external force, i.e., the mechanical polishing, such as, the sliding and/or the pressure, etc., while suppressing an increase of the resistance of the common wiring. Although the explanation was given on the liquid crystal display device, applying the ODF process therein; however, the present invention can be applied, not being restricted to that applying the ODF process therein, but also generally to the liquid crystal display devices, sealing between two pieces of the substrates by the sealing material including the UV ray curable type resin therein.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes which come within the meaning and range of equivalency of the claims are therefore intended to be embraced therein.

What is claimed is:

1. A liquid crystal display device, comprising:
   a TFT substrate, having pixel electrodes and TFTs thereon in a display region and having a wiring comprised of a material configured for shutting off UV rays on a peripheral region thereof;
   a facing substrate configured to be disposed to face the TFT substrate;
   a liquid crystal layer located between the TFT substrate and the facing substrate; and
   a sealing material, including a UV ray curable resin therein, and being formed on peripheral regions of the both substrate, to enclose the liquid crystal layer,
   wherein the wiring and the sealing material overlap at least in part thereof in an overlapping region,
   the wiring extends along a direction as an extending direction of the sealing material,
   plural numbers of opening portions are formed in the wiring in the overlapping region,
   the wiring in the overlapping region has a first area and a second area,
   the first area is nearer to the display region than the second area,
   an opening ratio of the opening portions in the first area is different from an opening ratio of the opening portions in the second area,
   the opening portions of the wiring are formed at intervals in the extending direction of the wiring, and
   a width of the opening portion in the extending direction of the wiring is wider than a width of each of the intervals between the opening portions in the extending direction of the wiring.

2. The liquid crystal display device, as described in the claim 1,
   wherein the opening ratio of the opening portions of the first area is 30 to 80%, while the opening ratio of the opening portions of the second area is 5 to 50%.

3. The liquid crystal display device, as described in the claim 2, wherein the opening ratio of the opening portions of the first area is 50 to 70%.

4. The liquid crystal display device, as described in the claim 2, wherein the opening ratio of the opening portions of the second area is 5 to 30%.

5. The liquid crystal display device, as described in the claim 1, wherein a width of the first area in a perpendicular direction to the extending direction is equal or greater than 30% with respect to a width of the sealing material in the perpendicular direction to the extending direction.

6. The liquid crystal display device, as described in the claim 1, wherein plural numbers of opening portions are formed in a third area of the wiring, wherein the third area is located between the overlapping region and the display region.

7. The liquid crystal display device, as described in the claim 6,
   wherein the opening portions of the wiring are formed at intervals in the extending direction of the wiring in the third area.

8. The liquid crystal display device, as described in the claim 6,
   wherein the wiring has a fourth area between the third area and the display region, and
   wherein an opening portion is not formed in the fourth area.

9. The liquid crystal display device, as described in the claim 1, wherein the plural numbers of opening portions are disposed, equally.

10. The liquid crystal display device, as described in the claim 1,
    wherein the wiring has a straight portion along a side of the TFT substrate and a turn around portion, and the turn around portion has opening portions.

11. The liquid crystal display device, as described in the claim 10,
    wherein the straight portion has opening portions, and wherein a shape of the opening portions in the straight portion of the wiring is different from a shape of the opening portions in the turn around portion of the wiring.

12. The liquid crystal display device, as described in the claim 1,
    wherein the wiring comprises a common wiring configured to supply common electric potential to the pixel.

13. The liquid crystal display device, as described in the claim 1,
    wherein a width of the first area in a perpendicular direction to the extending direction is equal or greater than 50% with respect to a width of the sealing material in the perpendicular direction to the extending direction.

14. The liquid crystal display device, as described in the claim 1, wherein an area of one of the opening portions in the first area is different from an area of one of the opening portions in the second area.

* * * * *